United States Patent [19]

Kelly et al.

[11] 4,137,548
[45] Jan. 30, 1979

[54] METHOD AND APPARATUS FOR OPTIMIZING COLOR PURITY IN A COLOR KINESCOPE

[75] Inventors: William R. Kelly; Robert L. Barbin, both of Lancaster, Pa.

[73] Assignee: RCA Corporation, New York, N.Y.

[21] Appl. No.: 783,478

[22] Filed: Mar. 31, 1977

[30] Foreign Application Priority Data

Sep. 30, 1976 [GB] United Kingdom ............... 40695/76

[51] Int. Cl.² ............................................ H04N 9/62
[52] U.S. Cl. ................................................... 358/10
[58] Field of Search ................. 358/10, 68; 315/13 C, 315/13 R, 13 CR, 37 Q

[56] References Cited

U.S. PATENT DOCUMENTS 3,916,437 10/1975 Barbin .................................... 358/10
4,001,877 1/1977 Simpson .................................. 358/10

Primary Examiner—John C. Martin
Assistant Examiner—Aristotelis M. Psitos
Attorney, Agent, or Firm—Eugene M. Whitacre; Paul J. Rasmussen; Joseph Laks

[57] ABSTRACT

A set of auxiliary deflection coils are placed on opposite sides of a multibeam color television picture tube having a deflection yoke and color purity adjustment apparatus. The tube is operated to cause a raster to be scanned. The auxiliary coils are energized to cause the beams to be deflected to the left from their normal beam landing sites by a predetermined amount during at least one vertical field and to the right for the nominal beam sites by a predetermined amount during at least one vertical field in order to simulate beam landing errors caused by factors present in the television tube use environment. Color purity is then adjusted in the presence of the simulated beam landing errors.

14 Claims, 12 Drawing Figures

METHOD AND APPARATUS FOR OPTIMIZING COLOR PURITY IN A COLOR KINESCOPE

BACKGROUND OF THE INVENTION

This invention relates to equipment for optimizing the color purity tolerance of color television picture tubes and particularly to an improvement whereby the optimized tolerance includes compensation for the earth's magnetic field, thermal expansion of the shadow mask, as well as a preselected safety factor.

The three beams of a color television picture tube must be adjusted in position for several reasons to enable a satisfactory picture to be reproduced on the viewing screen of the tube. Adjustment for color purity is required with all color picture tubes. The purity adjustment provides for the beams to land only on their respective color phosphor elements. Obviously, if the displayed picture lacks purity, the red beam, for example, might land on green or blue phosphors and result in a false color scene reproduction.

In a non-matrix type of color picture tube, the beam portion passing through an aperture of the shadow mask is smaller than the individual phosphor element on the viewing screen so that when it is properly landed on the desired phosphor element, it will not illuminate the adjacent different color elements. In a matrix-type of picture tube, in which dark guard bands separate adjacent different color phosphor elements, the beam portion passing through an aperture may be larger than the phosphor elements and still result in color purity. In both types of picture tubes, it is desirable to center the respective beams on their phosphor elements to minimize the possibility of a loss of purity if the beams are undesirably moved due to mechanical changes of the picture tube or stray magnetic fields.

It is generally recognized that purity may be controlled at the center portion of a viewing screen by varying the position of two magnetized purity rings mounted for rotatable motion about the neck of the picture tube. Purity is controlled at the edge regions of the picture tube by axial movement of the deflection yoke which moves the deflection center of the beams and hence controls their landing positions at portions away from the center of the viewing screen.

One method of adjusting color purity, using the purity rings and the deflection yoke, is disclosed in U.S. Pat. No. 3,916,437 issued to Barbon. Although this is an effective method for adjusting purity at the tube factory, misregister problems may arise after the picture tube has been installed in the television receiver. These problems are typically caused by the magnetic field environment present in the receiver which was not experienced during factory adjustment. These problems become particularly troublesome and expensive in those cases where the deflection yoke and purity rings are permanently immobilized after purity adjustment at the tube factory. In these situations, the receiver manufacturer must either install relatively expensive compensating circuitry in the receiver, or return the tube to the tube manufacturer taking the risk that the replacement tube may also develop purity errors.

One approach to solving these misregister problems involves simulating the magnetic environment of the receiver by placing pieces of metal at various locations around the deflection yoke. The size and location of the metal pieces are determined by trial and error until the misregister of the tube in the test system duplicates the misregister in the receiver. Since each type of receiver produced by each receiver manufacturer typically has its own unique magnetic field environment, it is apparent that simulating all possible receiver fields using pieces of metal is expensive, tedious, time consuming and may not always be possible.

Another approach is described in copending U.S. patent application, Ser. No. 783,215, filed Mar. 31, 1977, entitled "Method and Apparatus for Simulating Magnetic Environment of Television Receivers," inventors William Arthur Sonntag and Theodore F. Simpson. That method comprises placing a deflection yoke and color purity adjustment apparatus in operating positions relative to a multi-beam color television picture tube. In addition, a set of auxiliary coils are placed on opposite sides of the picture tube. The tube is then operated to cause a raster to be scanned on the viewing screen of the tube. The auxiliary coils are energized to cause the beams to be deflected from their nominal beam landing sites by a predetermined amount in a predetermined direction within each of at least two predetermined regions within the raster area. These predetermined deflections are chosen to approximate deflections which are likely to be caused by the magnetic environment present in the television receiver. Color purity of the tube is then adjusted using a prior art method such as that taught by Barbin in U.S. Pat. No. 3,916,437.

The method and apparatus of the above referenced copending application, although effective in compensating for receiver induced purity errors, does not account for other sources of purity errors, such as thermal expansion of the shadow mask, the effect of changes in strength and/or direction in the ambient magnetic field, and other less well-defined sources of error.

SUMMARY OF THE INVENTION

A method of optimizing color purity in a color television picture tube having at least two electron beams and a mosaic of recurring groups of luminescent deposits disposed on a screen, each of the deposits being located at a nominal landing site of an associated electron beam on the screen. The method comprises the steps of placing a deflection yoke and color purity adjustment apparatus in operating positions relative to the color picture tube. A set of auxiliary deflection coils is placed in predetermined spaced relation to the beams. A raster is caused to be scanned on the screen of the tube by at least one of the beams. The auxiliary coils are energized to cause the beam to be deflected, in a first direction, from its nominal landing site by a predetermined amount within each of at least two predetermined regions of the raster during a first period which comprises at least one vertical field. During a second period which comprises at least one vertical field, the auxiliary coils are energized to cause the beam to be deflected, in a second direction, from its nominal landing site by a predetermined amount within each of the regions of the raster. The color purity apparatus and the axial position of the deflection yoke are then adjusted in order to substantially equalize the excursions of the beam about its nominal landing site in each region.

DETAILED DESCRIPTION

Figure 1:
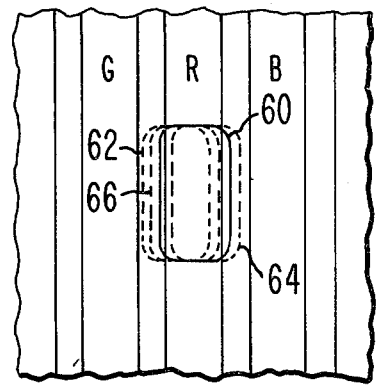
FIG. 1 depicts a portion of a television picture tube screen showing a nominal landing site of an electron beam as well as three deflected positions of the beam due to beam landing error sources present in the use environment.

It has been determined that the effects of purity errors induced by the operating environment, such as magnetic environment of the receiver, thermal expansion of the shadow mask, changes in the ambient earth's magnetic field resulting from different use locations and orientations, and other less well-defined sources, are cumulative and that, as shown in FIG. 1, each source contributes its own error in different regions of the raster. For example, the receiver alone may cause a 0.5 mil error to the left of the nominal beam landing site 60 in the region represented in FIG. 1. This error is indicated by dotted line 66. In the same region, the mask warpage alone might cause a 1 mil error to the right, this error being indicated by dotted line 64. The changes in the ambient earth's magnetic field might cause a 0.5 mil error to the left, also in the same region, the cumulative error caused by the receiver and the earth's magnetic field being indicated by dotted line 62.

Figure 2:
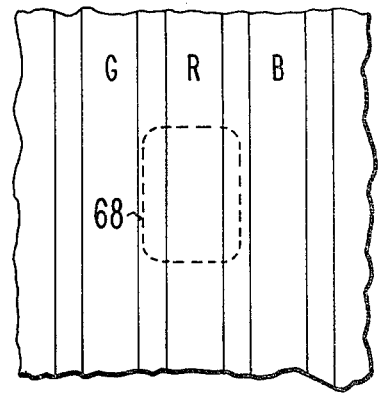
FIG. 2 depicts a portion of the television picture tube screen showing the cumulative effects of the beam landing errors depicted in FIG. 1.

As a result, the sum of all errors can be shown bounded by dotted line 68 in FIG. 2. This sum looks very much like an expanded beam; consequently, this expanded beam should be centered around its associated color phosphor stripe to optimize color purity. In this way, the beam will not clip adjacent color phosphor stripes even in the presence of one or more of the error producing elements. Consequently, the method of the present invention accomplishes optimized color purity as follows. A deflection yoke and color purity apparatus are placed in operating positions relative to a multi-beam color television picture tube. In addition, a set of auxiliary coils are placed on opposite sides of the picture tube. The tube is operated to cause a raster to be scanned on the viewing screen of the tube. The auxiliary coils are energized to cause the beams to be deflected to the left from their nominal beam landing sites by a predetermined amount during at least one vertical field, and to the right from the nominal beam landing site by a predetermined amount during at least one vertical field.

Figure 3:
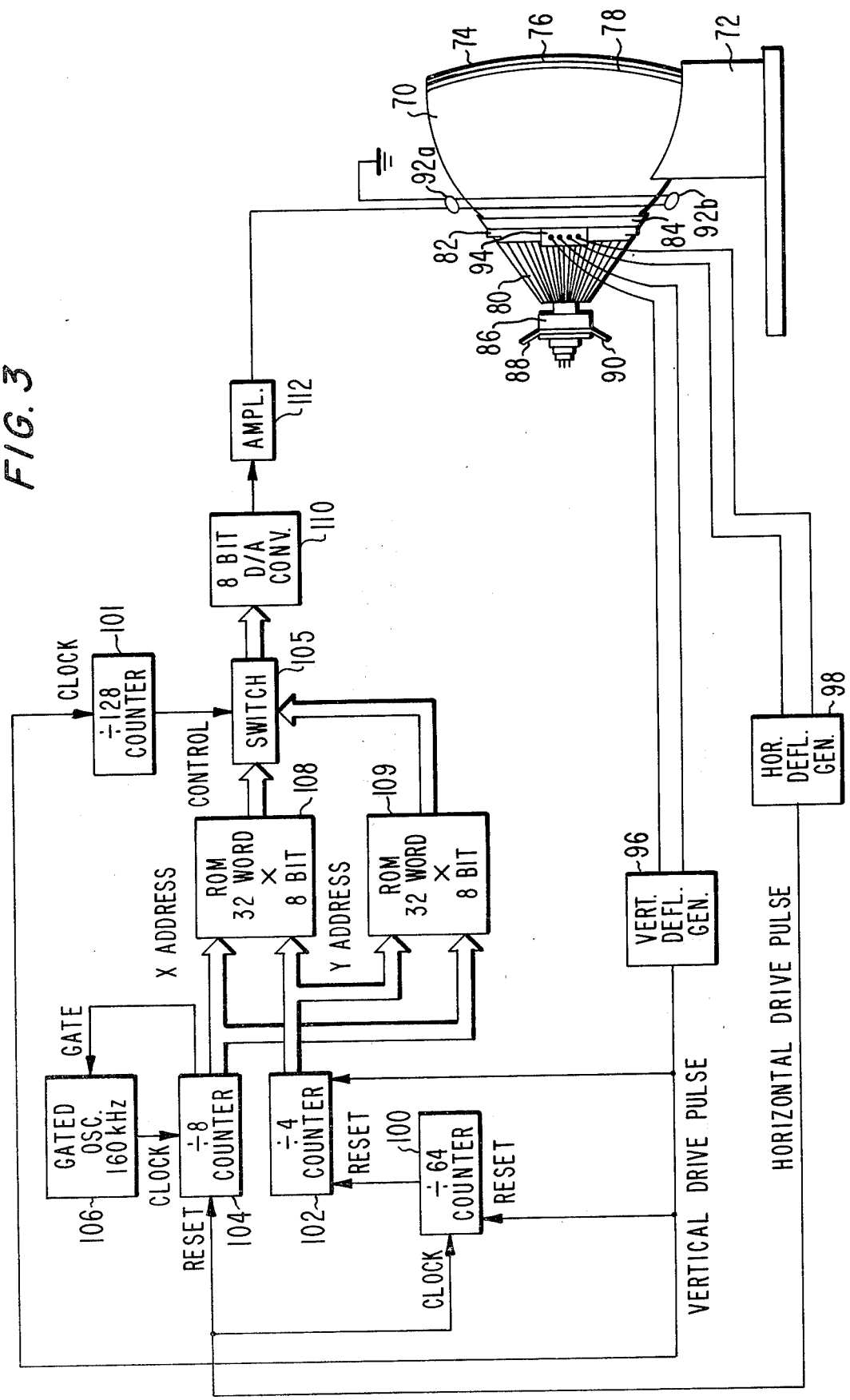
FIG. 3 is a combined side elevation view and functional block diagram of one embodiment of an apparatus for optimizing color purity in accordance with the invention.

FIG. 3 is a combined side elevation view and functional block diagram of a system for optimizing color purity in accordance with the above stated method. This particular system will introduce left and right errors of predetermined magnitudes in each of 32 regions of the raster area in an 8 × 4 matrix arrangement. By making changes in the counters and the size of the read only memories (ROM), a different number of regions can be formed, for example 25 regions in a 5 × 5 matrix arrangement. The errors can be programmed for one region independently of the other regions. In addition, the magnitude of the left deflection can be programmed independently of the magnitude of the right deflection within any given region. Once programmed, the beam landing errors for each region remains substantially constant throughout the region area.

As shown in FIG. 3, a color television picture tube 70 is fastened to a test fixture 72 by any suitable rigid attachment means. The picture tube 70 includes a viewing screen 74 having an inside surface on which are disposed a plurality of different colored phosphor stripes 76. An aperture mask 78 is spaced a relatively short distance to the rear of the phosphor stripes 76 for allowing portions of the picture tube electron beams to pass through the apertures to strike their respective color phosphor stripes.

A deflection yoke 80, comprising horizontal and vertical deflection coils, is fixed to a mounting member 82 which is in turn fitted against a mounting member 84 which is fixedly attached to the glass envelope of the picture tube 70. The mounting members are selected to allow for relative motion between the deflection yoke 80, mounting member 82 and mounting member 84. Any suitable arrangement for securing member 82 to member 84 when satisfactory position is achieved may be utilized. A static convergence assembly 86 is mounted around the neck portion of the picture tube 70 to the rear of the deflection yoke 80. Static convergence assembly 86, which may be of a known type, is utilized to converge the red, green and blue electron beams of the picture tube in the center region of viewing screen 74. To the rear of the static convergence assembly 86 are disposed a pair of color purity adjusting rings 88 and 90. These rings are magnetized across a diameter of each ring so that rotation of the rings about the neck of the picture tube 70 will cause the three electron beams to move in the same direction.

Disposed about the top and bottom portions of the picture tube 70 and fixedly mounted, by any suitable means, to the test fixture 72, are a pair of auxiliary deflection coils 92a and 92b. The coils 92a and 92b extend in horizontal directions on opposite portions of the funnel portion of the picture tube 70. When energized, these deflection coils produce a vertical magnetic field which serves to shift the electron beams of the picture tube 70 in horizontal directions. The energizing current produces a magnetic field which shifts the beam to the left or the right depending upon the direction of energizing current flow. The magnetic field produced by coils 92a and 92b is in addition to the normal deflection field produced by the deflection coils of the deflection yoke 80. Note that although the preferred embodiment utilizes a pair of auxiliary coils extending in horizontal directions, any suitable coil configuration which produces a substantially vertical magnetic field for deflecting the beam in a horizontal direction, can be used.

The horizontal and vertical deflection coils of the deflection yoke 80 are electrically connected to terminals on a terminal board 94. A vertical deflection generator 96 provides scanning current at the vertical deflection rate (60 Hz) and is coupled to the terminal board 94 for energizing the vertical deflection coils. A horizontal deflection generator 98 provides scanning current at a horizontal deflection rate (15,750 Hz) and is coupled to terminal board 94 for providing scanning current for the horizontal deflection coils.

As previously stated, the method disclosed herein includes similating purity error sources by deflecting the beams to the left by a predetermined amount and to the right by a predetermined amount in each of at least two predetermined regions of the raster. Measurements at various locations on the viewing screen have shown that the magnitudes of beam deflection from the nominal landing site due to the error causing sources may, and generally do, vary from location to location throughout the viewing area. Consequently, any meaningful simulation of all misregister causing elements should attempt to emulate the varying magnitudes of beam deflection. In fact, the simulation of highest fidelity would require duplication of beam landing errors in both right and left directions at every beam landing site. Since the number of sites in a color television picture tube is in the order of 1,000,000, absolute fidelity is impractical and, since the difference in error between adjacent sites is minimal, unnecessary. In the preferred embodiment disclosed herein, 32 regions, each having a discrete right and left beam landing error associated therewith, have been chosen as a practical approximation. This is not to say, however, that a different number of regions, for example 25 arranged in a 5 × 5 matrix, is not also a practical approximation, the requirement being that there should be a minimum of two regions with the maximum number of regions depending upon the expenditure in time and money one is willing to make.

Figure 8:
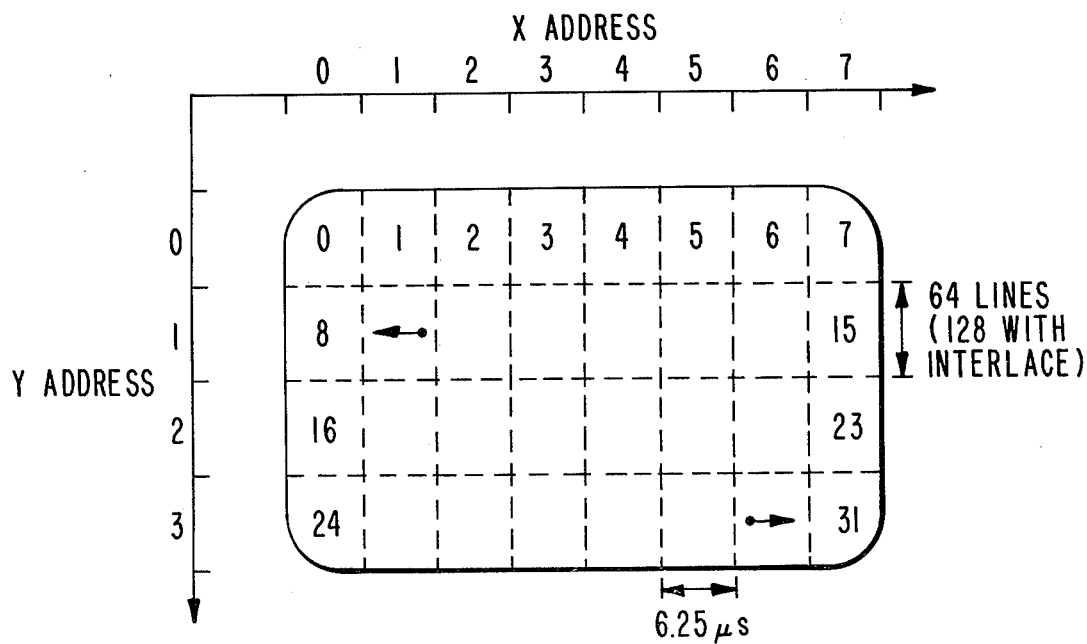
FIG. 8 is a front view of the picture tube showing the viewing screen schematically divided into 32 discrete regions.

FIG. 8 is a front view of the picture tube 70 showing the viewing screen 74 schematically divided into an 8 × 4 matrix of 32 discrete regions. The magnitudes of the left and right beam landing errors are programmable within each region, independent of the other regions. The electronic division of the raster into these regions is accomplished as follows. Each horizontal line time is substantially equal to 63 microseconds including 50 microseconds for hotizontal scan and 13 microseconds for retrace. Consequently, 8 discrete regions in the horizontal or X direction would require a change every 6.25 microseconds. Also, since there are approximately 256 horizontal lines scanned per vertical field, four discrete regions in the vertical or Y direction would require a change every 64 lines. Note that depending on such things as vertical retrace time and utilization of a number of lines for transmitted reference signals, the actual number of scan lines could be on the order of 225 per vertical field. In this case four regions in the vertical or Y direction, each having a substantially equal number of lines, would require a change every 56 lines. However, it should be noted that it is not mandatory that each region contain an equal number of lines; consequently, for a field containing 225 lines, a change every 64 lines would still fall within the scope of the present invention.

Referring again to FIG. 3, the vertical deflection generator 96 outputs a vertical drive pulse at the beginning of each vertical field. This vertical drive pulse is coupled to a ÷64 counter 100, a ÷128 counter 101 and a ÷4 counter 102. The vertical drive pulse functions as a clock input to the ÷128 counter 101. The vertical drive pulse also functions to reset the ÷64 and ÷4 counters at the beginning of each vertical field. The horizontal deflection generator 98 outputs a horizontal drive pulse at the beginning of each horizontal line. This horizontal drive pulse is coupled to the ÷64 counter 100 and a ÷8 counter 104 having a three-bit binary coded output. The horizontal drive pulse functions as a clock input to the ÷64 counter 100 and serves to reset the ÷8 counter 104 at the beginning of each horizontal line. The ÷64 counter 100 outputs a clock pulse to the ÷4 counter 102 once every 64 clock input pulses. The ÷128 counter 101 outputs a control signal to a two-input switch 105 once every 128 vertical drive pulses. The output of a gated oscillator 106 is coupled to the ÷8 counter 104. The oscillator frequency is 160 kHz and the output functions as a clock input to the ÷8 counter 104, causing the binary coded output of the counter to change state every 6.25 microseconds. The ÷8 counter 104 outputs a gate pulse which gates the 160 kHz oscillator 106 on, starting at the time the ÷8 counter 104 is reset and ending when ÷8 counter has reached the eighth count.

The ÷8 counter outputs a three-bit binary coded signal over three lines to a first 32 word by eight-bit read only memory (ROM) 108 and to a second 32 word by eight-bit ROM 109. The three-bit binary coded signal forms the X address portion of the five-bit address input to the first and second ROM's 108 and 109. The ÷4 counter 102 outputs a two-bit binary coded signal over two lines to the first and second ROM's 108 and 109. The two-bit binary coded signal forms the Y address portion of the five-bit address inputs to the ROM's. The first ROM 108 outputs an eight-bit binary coded data word over eight lines to one input of the two-input switch 105. The second ROM 109 outputs an eight-bit binary coded data word over eight lines to the second input of the two-input switch 105. The control signal from the ÷128 counter 101 causes either the data word from the first ROM 108 or the data word from the second ROM 109 to appear at the output of the switch 105. The output of the switch 105 is coupled over eight lines to an eight-bit digital-to-analog (D/A) converter 110. The most significant bit of each eight-bit data word determines the sign of the D/A output while the remaining seven bits determines the magnitude. The output of the D/A converter 110 is coupled to a power amplifier 112. The power amplifier 112 supplies current to the auxiliary deflection coils 92a and 92b.

Prior to operation of the system, each ROM is programmed in a conventional manner (see Harris Semiconductor Catalog, August 1975, pages Me-55 through Me-57), in order to place the proper data in each memory location. This data is obtained by measuring known beam landing errors in each region due to magnetic environment of the receiver, mask warpage due to temperature changes, effects of changes in the earth's magnetic field, and other sources of beam landing error. The direction and magnitude of the beam landing error due to each of these sources is recorded. Since the magnitude and direction of energizing current in the auxiliary deflection coils 92a and 92b, which would cause equivalent beam landing shifts is known, the corresponding digital data is programmed into each memory location of the ROM's. For example, if the beam landing error is measured to be 1 mil to the left in location none (01001) and it is known that digital data word 10010000 will produce a 1 mil shift to the left, then 10010000 will be programmed into location 01001 in the appropriate ROM.

Figure 4A:
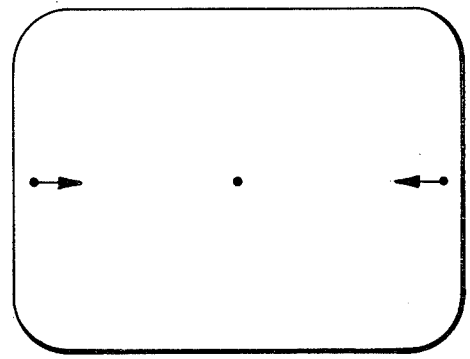
FIG. 4A and 4B depict how axial movement of a deflection yoke in a first direction affects beam landing shift as well as the wave form of the auxiliary deflection coil energizing current required to simulate this axial movement.
Figure 4B:
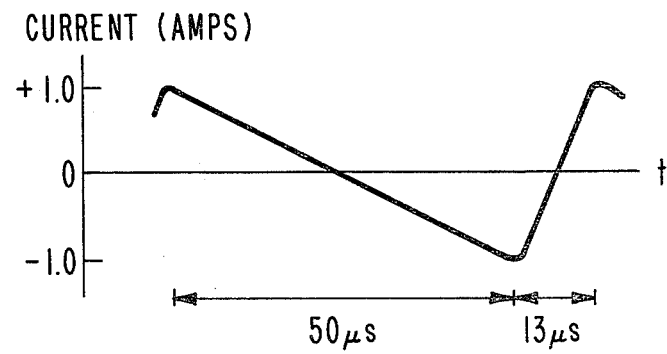

Care must be taken in programming the appropriate ROM for the following reasons. FIG. 4a shows how axial movement of the deflection yoke in a first direction would affect beam landing shift. The beam landing site on the left of the viewing screen would be moved toward the center. The beam landing site at the center of the viewing screen would remain unchanged, and the beam landing site on the right of the viewing screen would move toward the center. The waveform of the auxiliary deflection coil energizing current required to simulate this actual movement of the yoke is depicted in FIG. 4b. At the beginning of the horizontal line, a relatively large amount of current, for example +1 amp, would be required to deflect the nominal beam landing site at the left side of the viewing screen by the appropriate distance toward the center. Similarly, a relatively large amount of current, for example 1 amp, flowing in the opposite direction, would be required to deflect the beam landing site on the right side of the viewing screen the same distance toward the center. Consequently, as shown in FIG. 4b, the energizing current must vary from +1 amp to −1 amp during the 50 microsecond horizontal scan time. The severe problem arises when attempting to scan the next horizontal line. This is due to the fact that at the beginning of the next horizontal line +1 amp would again be required to deflect the left hand beam landing site towards the center. This would necessitate the switching from −1 amp at the end of one horizontal line to +1 amp at the beginning of the next horizontal line or, in the example shown here, it would require the switching of two amps during the 13 microsecond retrace time.

Figure 5A:
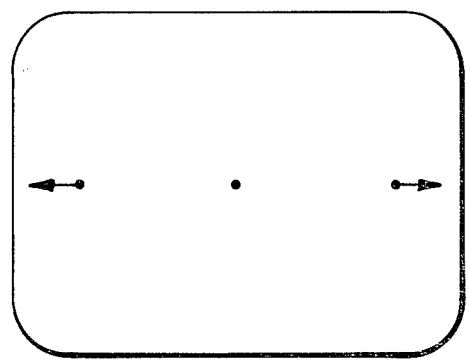
FIG. 5a and 5b depict how axial movement of the deflection coil in a second direction affects beam landing shift as well as the wave form of the auxiliary deflection coil energizing current required to simulate this axial movement.
Figure 5B:
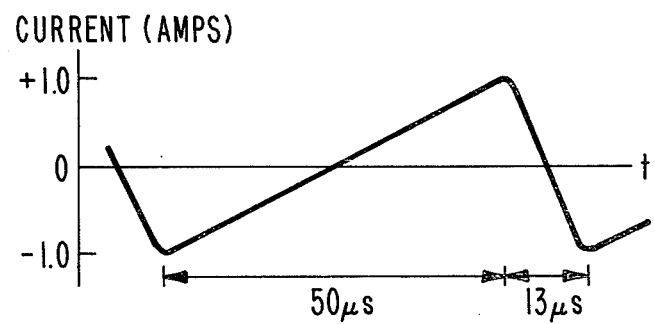

As shown in FIGS. 5a and 5b, a similar problem arises when attempting to simulate the axial movement of the deflection yoke in a second direction opposite the first direction. This would require the power amplifier 112 to switch from +1 amp to −1 amp during the 13 microsecond retrace time.

Figure 6A:
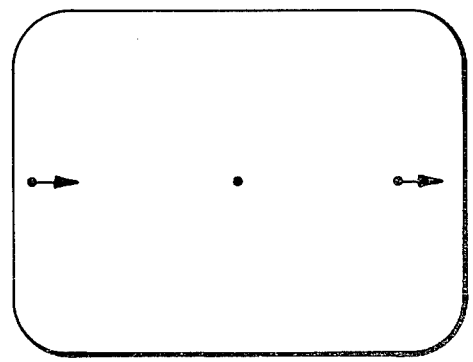
FIG. 6a and 6b depict beam landing shift induced in a first direction and the current wave form required to produce this shift.
Figure 6B:
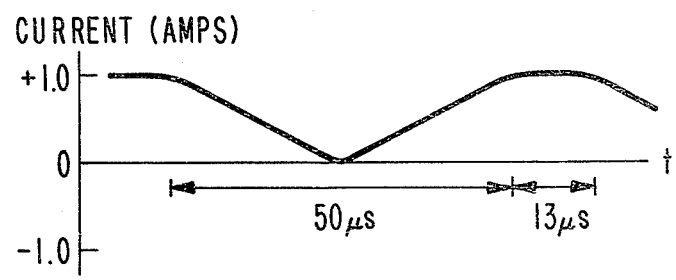
Figure 7A:
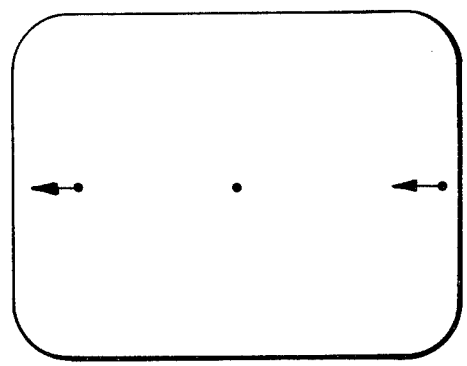
FIG. 7a and 7b depict beam landing shift induced in a second direction as well as the current wave form required to produce this shift.
Figure 7B:
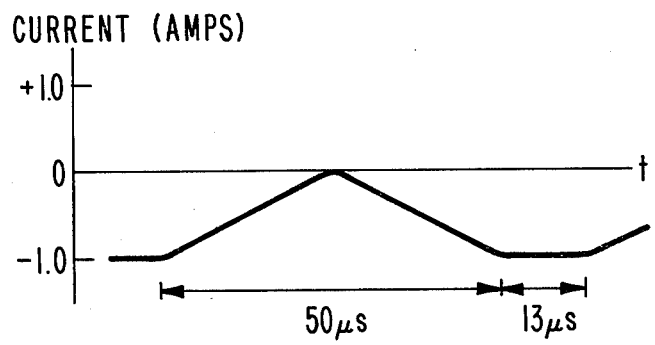

The switching problem can be solved by programming the ROM's such that all induced beam landing shifts occur in one direction during at least one vertical field and in the opposite direction during at least one vertical field. The representative beam landing movements and associated waveforms are shown in FIGS. 6a and 6b, 7a and 7b. As shown in FIGS. 6a and 6b, since all beam landing shifts occur toward the right, the current need vary only from, for example, +1 amp at the beginning of a horizontal line down to zero, then back up to a +1 amp at the end of the horizontal line. As a result, the current can remain at +1 amp during the 13 microsecond retrace time. Similarly, as shown in FIGS. 7a and 7b, the current need only vary from −1 amp to zero, back to −1 amp during the 50 microsecond line time and can remain at −1 amp during the 13 microsecond retrace time.

In order to present the operator with a readily observable display for detecting purity errors, it is desirable that the beam landing shifts in a particular direction take place for at least two successive vertical fields. This will provide the operator with a more persistent display of color purity in each direction. In the embodiment disclosed herein, the shift in each direction occurs for 128 successive vertical fields. That is, a beam landing deflection toward the right will take place for 128 vertical fields, beam landing deflection toward the left will take place for the next 128 vertical fields, followed by 128 vertical fields of beam landings to the right and so on. As a result, the first ROM 108 is programmed, for example, with nothing but right beam landing errors while the second ROM 109 is programmed with nothing but left beam landing errors.

After programming has been completed, the tube is energized and a raster is scanned continuously. Two of the three beams are cut off, for example, the blue and green beams, leaving only the red field. The counters 100, 102 and 104 are reset or initialized at the start of each vertical field scan by the horizontal and vertical drive pulses. The ÷8 counter 104 and the ÷4 counter 102 together output a five-bit address word (for example 0000) to the first and second ROM's 108 and 109 each of which outputs a data word contained at that address, for example 10000101 at the first ROM output and 00000101 at the output of the second ROM. The two-input switch 105 presents the data word from one ROM to the input of the eight-bit D/A converter 110 for 128 successive vertical fields. This is determined by the ÷128 counter 101 which counts 128 successive vertical drive pulses, then sends a signal to the two-input switch 105 which then switches the output of the other ROM to the input of the D/A converter 110. After 128 vertical fields, the output of the first ROM is again switched to the input of the D/A converter 110. This switching continues throughout the duration of the test. The D/A 110 converts the digital data word present at its input to an analog signal which is coupled to the power amplifier 112. The power amplifier 112 provides an energizing current to the auxiliary coils 92a and 92b, the magnitude and direction of which is a function of the eight-bit data word located in the appropriate ROM address.

6.2 microseconds later the output of the ÷8 counter 104 changes state, to, for example 001, causing the five-bit address word input to the ROM's to become 00001. In other words, the X address is advanced by one count and the Y address remains unchanged. Both ROM's will then output the eight-bit data word which has been preprogrammed into their respective memory locations 00001. Depending on the state of the two-input switch 105, one of these data words will be coupled to the D/A converter 110 which will convert the digital data word into an analog signal which will be amplified by the power amplifier 112 and coupled to the auxiliary deflection coils 92a and 92b. The X address continues to advance by one each 6.25 microseconds until it reaches seven (111), at which time the ÷8 counter 104 gates the oscillator 106 off. At the beginning of the next horizontal line, the ÷8 counter is reset and the process repeats itself. Since the ÷4 counter output remains unchanged for 64 lines, the Y address remains unchanged and address location 00000 00111 are repeated for 64 horizontal lines. After the 64th line has been scanned, the ÷64 counter 101 outputs a clock pulse which advances the ÷4 counter 102. Consequently, at the beginning of the 65th horizontal line scan, the Y address is advanced by one and the five-bit address word is, for example, 01000. The X address locations are advanced eight times each horizontal line for 64 lines while the new Y address remains unchanged. This causes the induced beam landing error to remain substantially constant within each region defined by one-eighth of a scan line in the horizontal direction and 64 lines in the vertical direction. As previously stated, the direction of the induced beam landing error remains the same throughout all regions for 128 successive vertical fields. However, the magnitude of the error changes from region to region depending upon the data program and the corresponding ROM address. The end result is that the raster is effectively divided into 32 regions, each of which has an independently programmed beam landing error to the left and an independently programmed beam landing error to the right. This effectively increases the width of the beam landing as shown in FIG. 2. Color purity is now adjusted in accordance with the prior art technique in associated color phosphor stripe.

The aforementioned procedure is repeated for the blue field (red and green beams cut-off), the green field (red and blue beams cut-off) and the white field (all beams on). It is possible that a skilled operator might be able to optimize color purity in accordance with this method using only the white field or the red field for example. It should be noted that the use of one or more fields, or any combination thereof, is considered to fall within the scope of the present invention. Adjusting color purity in the presence of induced left and right beam landing errors introduced in accordance with this invention, will optimize color purity and substantially eliminate errors induced by the operating environment.

While the foregoing has been described in accordance with U.S. Television Standards, European or other television standards can be accommodated by making appropriate changes in the numerical values of the counters and in the oscillator frequency.

We claim:

1. A method of optimizing color purity in a color television picture tube while simulating the effects of error sources, said tube having at least two electron beams and a mosaic of recurring groups of luminescent deposits disposed on a screen, each of said deposits being located at a nominal landing site of an associated electron beam on said screen, said tube subject to the effects of error movement from said error sources, said error movement moving the landing site of said associated electron beam from said nominal landing site in a first direction by a first predetermined magnitude in a first region of said raster, said error movement moving said landing site in a second direction by a second predetermined magnitude in a second region of said raster, said method comprising the steps of:

placing a deflection yoke and color purity adjustment apparatus in operating positions relative to said color television picture tube;

placing a set of auxiliary deflection coils that is responsive to auxiliary deflection signals in predetermined spaced relation to said beams;

storing in a memory storage apparatus various values of said auxiliary deflection signals representing the various amounts of auxiliary deflection of said electron beam that are required to be produced by said auxiliary magnetic field in each of said first and second regions of said raster in each of said first and second directions for creating a simulated expanded electron beam for simulating the error movement of selected ones of said error sources, the position and width of said simulated expanded electron beam with respect to the nominal landing sites of said electron beam being determined by appropriate selection of said various values;

operating said tube to cause a raster to be scanned on said screen by at least one of said beams;

coupling said auxiliary deflection signals from said memory storage device to said auxiliary coils;

energizing said auxiliary coils with current to cause the beam to be deflected by said various amounts of auxiliary deflection, in said first direction, during a first period;

energizing said auxiliary coils with current to cause the beam to be deflected by said various amounts of auxiliary deflection, in said second direction, during a second period, each of said first and second periods comprising at least one vertical field for minimizing the current switching requirements of said auxiliary coils; and adjusting said color purity apparatus for the desired degree of color purity.

2. The method in accordance with claim 1 wherein said color television picture tube includes a multi-beam electron gun assembly which generates three in-line electron beams and wherein each recurring group of luminescent deposits comprises three different color emitting vertical phosphor strips which are in substantially parallel spaced relation to each other and substantially perpendicular to the direction of electron beam scanning, in which step (d) comprises deflecting said beam from its nominal beam landing site in said first direction which is substantially perpendicular to said vertical phosphor strips within each of said regions during said first period.

3. The method in accordance with claim 2 wherein step (e) comprises deflecting said beam from its nominal beam landing site in said second direction which is reverse to said first direction within each of said regions during said second period, said first and second periods alternating during performance of said method.

4. The method in accordance with claim 3 wherein step (c) comprises operating said tube to cause a raster to be scanned on said screen by all three of said beams and including additional steps as follows:

(g) switching off a second and third of said three in-line beams, operating said tube to cause a raster to be scanned on said screen by a first of said beams and repeating steps (d) through (f);

(h) switching off said first and third beams, operating said tube to cause a raster to be scanned on said screen by said second beam and repeating steps (d) through (f); and (i) switching off said first and second beams, operating said tube to cause a raster to be scanned on said screen by said third beam and repeating steps (d) through (f).

5. A method of optimizing color purity in a color television picture tube including an in-line, three beam electron gun assembly and a mosaic of recurring groups of three different color emitting strips disposed on a screen in substantially parallel spaced relation to each other and substantially perpendicular to a direction of electron beam scanning, each of said three different color emitting phosphor strips being located at a nominal landing point of an associated electron beam on said screen, said method comprising the steps of:

(a) placing a deflection yoke and color purity adjustment apparatus in operating positions relative to said color picture tube;

(b) placing a set of auxiliary deflection coils in predetermined spaced relation to said beams;

(c) switching off the two outside ones of said three in-line beams and operating said tube to cause a raster to be scanned by the remaining beam;

(d) energizing said auxiliary coils to cause the beam to be deflected to the left of its nominal beam landing site by a predetermined amount within each of at least two regions of substantially equal areas during a first period of at least two successive vertical fields;

(e) energizing said auxiliary coils to cause the beam to be deflected to the right of its nominal beam landing site by a predetermined amount within each of said regions during a second period of 128 successive vertical fields, said first and second periods alternating during performance of said method;

(f) adjusting said color purity apparatus and the axial position of said deflection yoke in order to substantially equalize the left and right excursions of said beam about its nominal landing site in each region;

(g) repeating steps (d) through (f) for each of the two other beams; and (h) operating said tube to cause a raster to be scanned on said screen by all three of said beams and repeating steps (d) through (f).

6. A method in accordance with claim 5 wherein step (d) comprises energizing said auxiliary coils to cause the beam to be deflected to the left of its nominal beam landing site by a predetermined amount within twenty-five regions of substantially equal areas arranged in a five by five matrix array during a first period of 128 successive vertical fields.

7. A method in accordance with claim 5 wherein step (d) comprises energizing said auxiliary coils to cause the beam to be deflected to the left of its nominal beam landing site by a predetermined amount within thirty-two regions of substantially equal areas arranged in an eight by four matrix array during a first period of 128 successive vertical fields.

8. An apparatus for optimizing color purity in a color television picture tube while simulating the effects of error sources, said tube having at least two electron beams and a mosaic of recurring groups of luminescent deposits disposed on a screen, each of said deposits being located at a nominal landing site of an associated electron beam on said screen, said picture tube subject to the effects of error movement from said error sources, said error movement moving the landing site of said associated electron beam from said nominal landing site in a first direction by a first predetermined magnitude in a first region of said raster, said error movement moving said landing site in a second direction by a second predetermined magnitude in a second region of said raster, said apparatus comprising:

mounting means for holding said color picture tube and a color purity adjustment assembly and deflection yoke in operating relationship relative to said picture tube;

a pair of auxiliary deflection coils mounted on said mounting means and responsive to auxiliary deflection signals for developing an auxiliary magnetic field;

means for storing various values of said auxiliary deflection signals representing the various amounts of auxiliary deflection of said electron beam that are required to be produced by said auxiliary magnetic field in said first and second regions of said raster in said first and second directions for creating a simulated expanded electron beam for simulating the error movement of selected ones of said plurality of error sources, the position and width of said simulated expanded electron beam with respect to the nominal landing sites of said electron beam being determined by appropriate selection of said various values;

means for energizing said deflection yoke at normal field and line deflection rates for scanning a raster on said screen with at least one of said electron beams;

means for coupling said auxiliary deflection signals from said storing means to said auxiliary deflection coils;

means for energizing said auxiliary coils with current to cause the beam to be deflected by said various amounts of auxiliary deflection, in said first direction, during a first period;

means for energizing said auxiliary coils with current to cause the beam to be deflected by said various amounts of auxiliary deflection, in said second direction, during a second period, each of said first and second periods comprising at least one vertical field for minimizing the current switching requirements of said auxiliary coils; and color purity adjusting apparatus for adjusting said tube to a desired degree of color purity.

9. An apparatus in accordance with claim 8 wherein said color television picture tube includes a multi-beam electron gun assembly which generates three in-line electron beams and wherein each recurring group of luminescent deposits comprises three different color emitting vertical phosphor strips which are in substantially parallel spaced relation to each other and substantially perpendicular to the direction of electron beam scanning in which said first direction is the direction of line scanning and said second direction is reverse to the line scanning direction.

10. An apparatus in accordance with claim 9 wherein said first and second periods alternate, each comprising 128 vertical fields.

11. An apparatus in accordance with claim 10 wherein said raster encompasses thirty-two regions of substantially equal areas arranged in an eight by four matrix array.

12. An apparatus in accordance with claim 10 wherein said raster encompasses twenty-five regions of substantially equal areas arranged in a five by five matrix array.

13. A method of providing a simulated expanded electron beam in a color kinescope with a mosaic of recurring luminescent deposits, each of said deposits being located at a nominal landing site of said electron beam, said kinescope subject to a plurality of error sources, each of said error sources causing said electron beam to move from its nominal landing site in at least 2 regions within a raster in at least one of first and second directions by given magnitudes, said method comprising the steps of:

placing a deflection apparatus and color purity adjustment device in operative positions relative to said kinescope;

placing an auxiliary magnetic apparatus that is responsive to auxiliary deflection signals in a predetermined spaced relation to said electron beam for developing an electron beam moving auxiliary magnetic field;

storing in a memory storage apparatus various values of said auxiliary deflection signals representing the various amounts of auxiliary deflection of said electron beam that are required to be produced by said auxiliary magnetic field in each of said at least two regions within said raster in said at least on of said first and second directions for creating said simulated expanded electron beam for simulating the error movements of selected ones of said plurality of error sources, the position and width of said simulated expanded electron beam with respect to the nominal landing sites of said electron beam in each of said at least 2 regions being determined by appropriate selection of said various values;

operating said kinescope to cause a raster to be scanned by said electron beam;

simulating the error movements of selected ones of said plurality of error sources by coupling said auxiliary deflection signals from said memory storage apparatus to said auxiliary magnetic apparatus to create said simulated expanded electron beam; and adjusting said color purity adjustment device in a predetermined manner while simulating said selected ones of said error sources.

14. An apparatus providing a simulated expanded electron beam in a color kinescope with a mosaic of recurring luminescent deposits, each of said deposits being located at a nominal landing site of said electron beam, said kinescope subject to a plurality of error sources, each of said error sources causing said electron beam to move from its nominal landing site in at least two regions within a raster in at least one of first and second directions by given magnitudes, said apparatus comprising;

securing means for holding said kinescope, a deflection apparatus and a color purity adjustment device in operative positions relative to said kinescope;

an auxiliary magnetic apparatus held in a predetermined spaced relation to said electron beam and responsive to auxiliary deflection signals for developing an electron beam moving auxiliary magnetic field;

memory storage apparatus capable of storing various values of said auxiliary deflections signals representing the various amounts of auxiliary deflection of said electron beam that are required to be produced by said auxiliary magnetic field in each of said two regions within said raster in at least one of said first and second directions for creating said simulated expanded electron beam for simulating the error movements of selected ones of said plurality of error sources, the position and width of said simulated expanded electron beam in each of said two regions with respect to the nominal landing sites of said electron beam being determined by appropriate selection of said various values;

means for operating said kinescope to cause a raster to be scanned by said electron beam;

means for coupling said auxiliary deflection signals from said memory storage apparatus to said auxiliary apparatus for creating said simulated expanded electron beam for simulating said error movements; and means for adjusting said color purity adjustment device in a predetermined manner while simulating said selected ones of said error sources.

* * * * *

UNITED STATES PATENT AND TRADEMARK OFFICE
CERTIFICATE OF CORRECTION

PATENT NO. : 4,137,548
DATED : January 30, 1979
INVENTOR(S): William R. Kelly, et al.

It is certified that error appears in the above-identified patent and that said Letters Patent is hereby corrected as shown below:

Column 12, line 68, that portion reading "on" should read -- one --.

Signed and Sealed this

Fifteenth Day of May 1979

[SEAL]

Attest:

RUTH C. MASON
Attesting Officer

DONALD W. BANNER
Commissioner of Patents and Trademarks